United States Patent [19]
Lee

[11] Patent Number: 5,562,474
[45] Date of Patent: Oct. 8, 1996

[54] BASE BODY AND TERMINAL OF A SOCKET ASSEMBLY FOR AN INTEGRATED CIRCUIT CHIP

[75] Inventor: Kuei-Yang Lee, Taipei City, Taiwan

[73] Assignee: Land Win Electronic Corp., Taipei City, Taiwan

[21] Appl. No.: 322,773

[22] Filed: Oct. 13, 1994

[51] Int. Cl.[6] ................................................ H01R 4/50
[52] U.S. Cl. ........................................ 439/342; 439/259
[58] Field of Search ................................. 439/342, 259, 439/682, 862

[56] References Cited

U.S. PATENT DOCUMENTS

| | | | |
|---|---|---|---|
| 2,664,552 | 12/1953 | Ericsson et al. | 439/682 |
| 4,887,974 | 12/1989 | Ichimura et al. | 439/259 |
| 5,342,214 | 8/1994 | Hsu | 439/342 |
| 5,454,727 | 10/1995 | Hsu . | |

*Primary Examiner*—Neil Abrams
*Assistant Examiner*—Yong Kim
*Attorney, Agent, or Firm*—Brooks & Kushman P.C.

[57] ABSTRACT

A head portion of a terminal is formed substantially as an L-shaped member which has a substantially horizontal section, a slantingly and upwardly extending section and a distal end portion for contacting with a pin of an IC chip. The body portion is provided with an engaging units for mounting onto a base body. The width in a transverse direction of the head portion of a terminal is smaller than that of the body portion thereof. The configuration of a terminal-receiving hole in a base body of a socket assembly is shaped such that the head portion of the terminal can pass and can engage receivingly the engaging units from the bottom surface of the base body.

7 Claims, 7 Drawing Sheets

BASE BODY AND TERMINAL OF A SOCKET ASSEMBLY FOR AN INTEGRATED CIRCUIT CHIP

BACKGROUND OF THE INVENTION

1. Field of the Invention

This invention relates to a socket assembly for an integrated circuit (IC) chip, more particularly to a base body of the socket assembly which facilitates manufacturing of the socket assembly and a terminal employed in the base body.

2. Description of the Related Art

Referring to FIG. 1, a conventional socket assembly for an IC chip is shown to comprise a base body 1, a chip mounting plate 3 mounted on the base body 1, and an actuating lever 4 associated with the base body 1 and the mounting plate 3 for moving the latter slidingly on the former. The base body has a top surface 12, a bottom surface 13 and a plurality of terminal-receiving holes 11 formed therethrough for receiving pins of an IC chip which is to be mounted on the chip mounting plate 3 thereon, and a plurality of terminals 2 mounted respectively in the terminal-receiving holes 11 of the base body 1. The mounting plate 3 is provided with a plurality of through-holes 31 which correspond to the terminal-receiving holes 11 of the base body 1.

Referring to FIG. 2, the terminal 2 is shown to include a flat body portion 20, a vertical head portion 22 which is formed integrally with the flat body portion 20 and which projects upwardly therefrom, and a vertical leg portion 21 which is formed integrally with and which extends downwardly from the flat body portion 20. The vertical head portion 22 is provided with a curved contact portion 23.

Referring to FIG. 3(A), an IC chip 5 is mounted on the mounting plate 3 such that the pins 51 of the same extend into the terminal-receiving holes 11 of the base body 1 via the through-holes 31 of the mounting plate 3. Note that it is easy to insert the pins 51 of the IC chip 5 when the actuating lever 4 is at a vertical position. The actuating lever 4 can be pivoted in the direction indicated by the arrow "A" relative to the base body 1, as shown in FIG. 3(B), so that the pins 51 of the IC chip 5 will be moved in the terminal-receiving holes 11 to contact the curved contact portion 23 of the terminals 2.

Since the transverse width of the vertical head portion 22 of the conventional terminal 2 is greater than that of the body 20 and the vertical leg portion 21 thereof, the top edge of the head portion 22 of the terminals 2 should be substantially parallel to the top surface 12 of the base body 1. The terminals 2 are inserted into the terminal-receiving holes 11 from the top surface 12 of the base body 1, thereby resulting in a more complicated manufacturing process. It is noted that the terminals 2 are usually connected to a runner (not shown) prior to assembly. If the terminals 2 are to be inserted from the top surface 12 of the base body 1, the runner interconnects the head portions 22 of the terminals 2, making it inconvenient to remove the runner after inserting the terminals 2 in the base body 1. In addition, a special tool is needed to insert the terminals 2 from the top surface 12 of the base body 1 since the terminal inserting tools commonly employed in other conventional socket assemblies are capable of inserting terminals 2 only from the bottom surface of the base body.

Therefore, it is necessary to provide a terminal which can be inserted into the base body from the bottom surface of the base body, i.e. the head portion of the terminal is inserted first in the receiving hole so as to increase the production efficiency of the socket assembly.

It is further noted that, since the terminal 2 is provided with very few flexible portions, the terminal 2 should be made of a material with good resiliency so as to provide a sufficient biasing action, thereby increasing the cost of production.

Therefore, it would be appreciated if a terminal which has good biasing properties while utilizing a cheaper material can be developed so as to reduce the production cost.

SUMMARY OF THE INVENTION

The main objective of the present invention is to provide a socket assembly with a base body which permits insertion of terminals therein from a bottom surface thereof to facilitate manufacturing of the socket assembly.

Another objective of the present invention is to provide a terminal for the socket assembly, the terminal possessing good elastic properties so that no elastic fatigue would occur easily and can be produced at a relatively low cost.

According to the present invention, a socket assembly for an integrated circuit chip includes a base body which has a top surface, a bottom surface, a plurality of terminal-receiving holes formed through the top and bottom surfaces, and a plurality of conductive terminals mounted in the terminal-receiving holes. Each of the terminals has a flat body portion, a head portion which is formed integrally with and which projects upwardly from the flat body portion so as to be located adjacent to the top surface of the base body, and a leg portion which extends integrally and downwardly from the flat body portion and which projects out from the bottom surface of the base body.

The socket assembly is characterized in that the flat body portion has an upper edge, a lower edge opposite to the upper edge, and left and right end portions which are provided with engaging means. The head portion is formed substantially as an L-shaped member which has a transverse width smaller than that of the flat body portion and is constituted by a first section which extends integrally and substantially horizontally from the upper edge of the flat body portion, and a second section which is formed integrally with and which extends slantingly and upwardly from a distal edge of the first section opposite to the upper edge of the flat body portion and which forms an acute angle in cooperation with the first section. The second section further has a distal end portion for contacting a pin of the IC chip. The terminal-receiving hole is confined by a surrounding wall which is constituted by first and second pairs of opposed wall portions. The first opposed wall portions have two opposed slit recesses opened to the bottom surface for receiving engageably the engaging means of the flat body portion and for retaining the flat body therein so that the L-shaped member swings resiliently between the second opposed wall portions.

One of the second opposed wall portions has a recess shaped such that a section of the distal end portion of the terminal can be received therein and the recess opens to the top surface of the base body.

In a further preferred embodiment, the other one of the second pairs of opposed wall portions has a plane protrusion protruding toward to said one of the second pairs of opposed wall portions such that the surface of the plane protrusion contacts the pin of the IC chip, thereby increasing, in cooperation with the terminal, the force for retaining the pin in the receiving hole.

In another preferred embodiment, the engaging means includes at least one protrusion which projects outwardly from the plane of the opposed end portions of the flat body portion and which engages the walls defining the slit recess. The contact face of the terminal and one of the second wall portions cooperatively define a pin receiving space which has a width that is smaller than the diameter of a pin of the IC chip so that the pin is received resiliently in the receiving space of the base body when the IC chip is moved from an inserted position to the pin receiving space of the terminal-receiving hole of the base body.

BRIEF DESCRIPTION OF THE DRAWINGS

Other features and advantages of the present invention will become more apparent in the following detailed description of the preferred embodiments with reference to the accompanying drawings, in which.

DETAILED DESCRIPTION OF THE PREFERRED EMBODIMENT

Since this invention is directed to improvements in the base body and the terminal of the socket assembly described in the prior art, only the characterizing parts of this invention will be described hereinafter.

Figure 1:
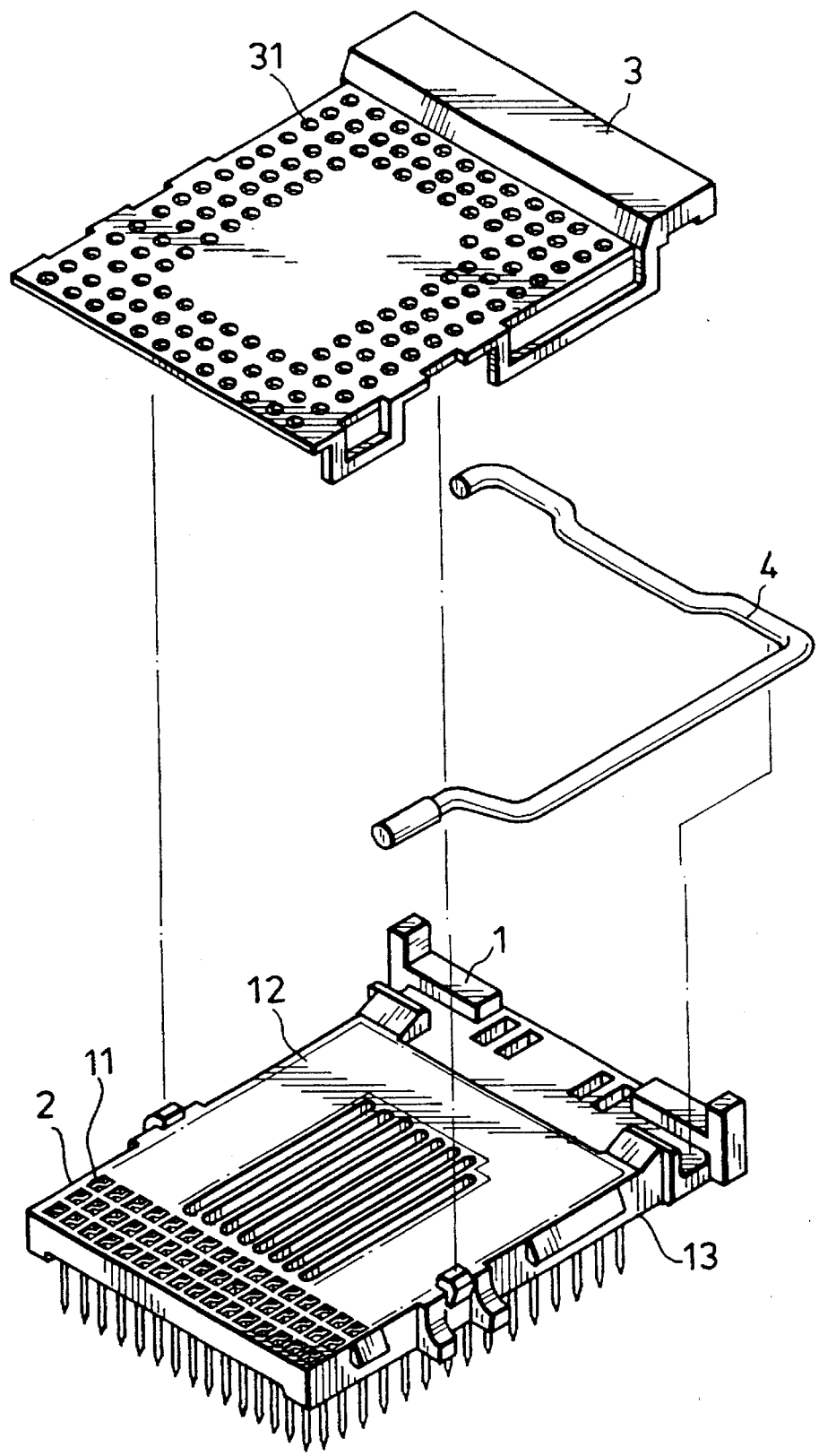
FIG. 1 shows an exploded view of a conventional socket assembly for an IC chip.
Figure 2:
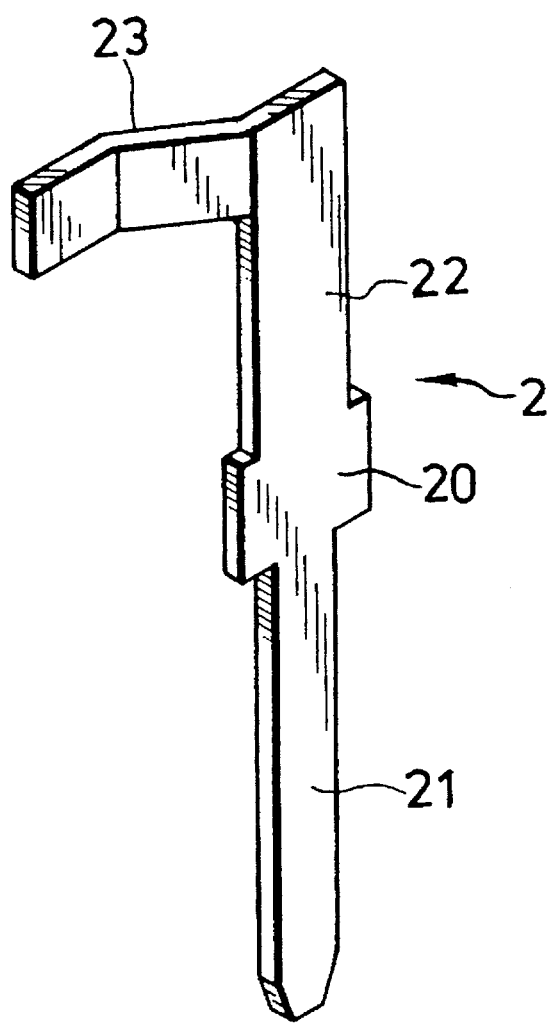
FIG. 2 is an enlarged view of a terminal which is employed in a base body of the conventional socket assembly shown in FIG. 1.
Figure 3A:
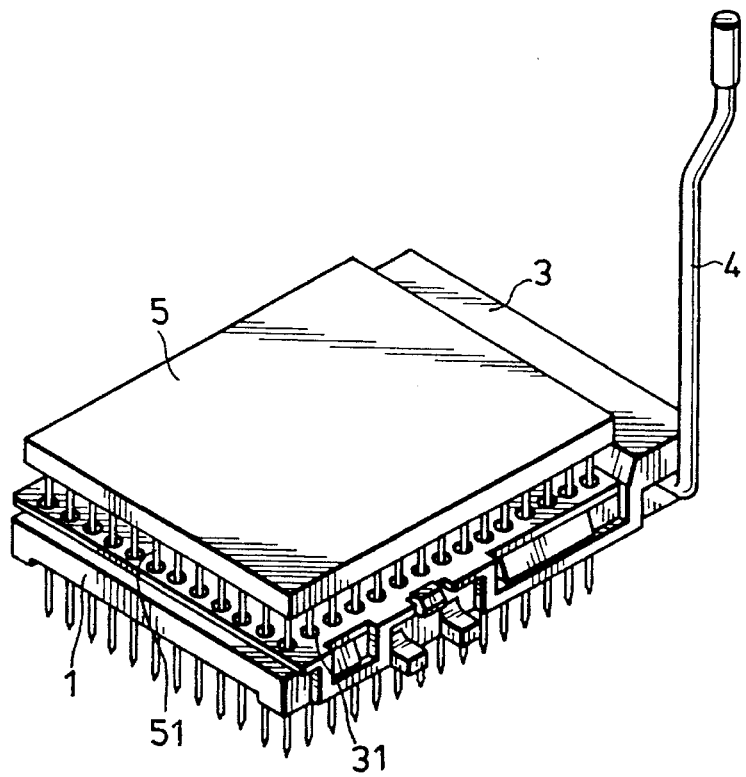
FIG. 3(A) shows an assembled view of the conventional socket assembly, illustrating an IC chip being mounted thereon.
Figure 3B:
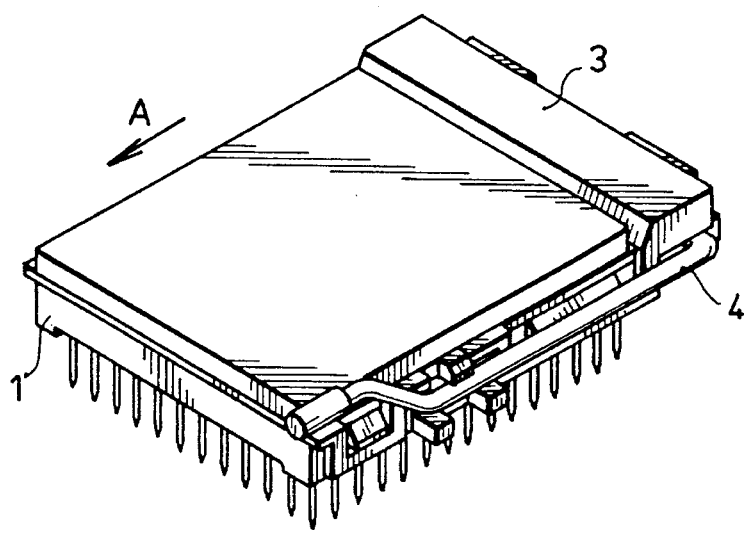
FIG. 3(B) shows the conventional socket assembly with the IC chip mounted thereon.
Figure 4:
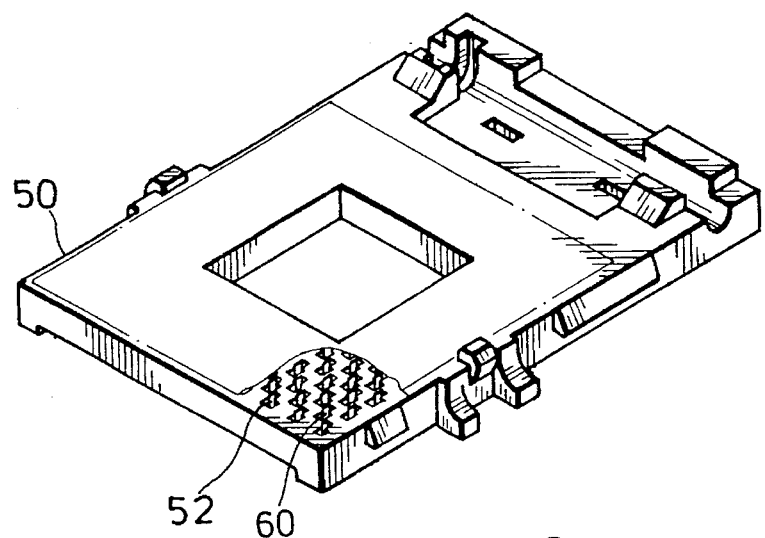
FIG. 4 shows a schematic, perspective view of a base body and terminals of a socket assembly according to the present invention.
Figure 5:
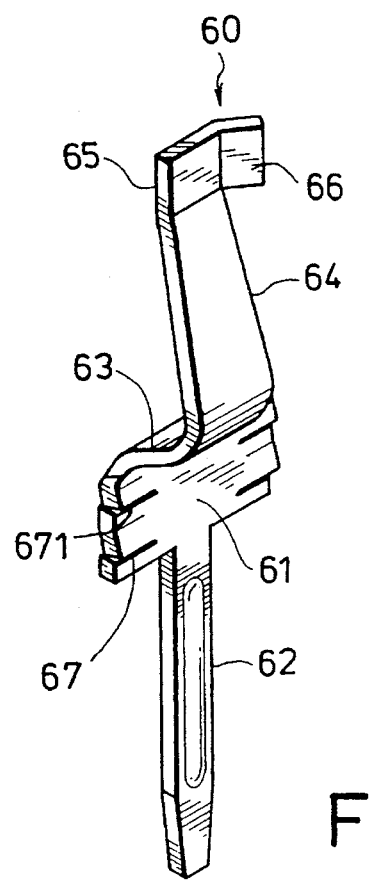
FIG. 5 shows an enlarged view of a terminal employed in the base body of FIG. 4.
Figure 6:
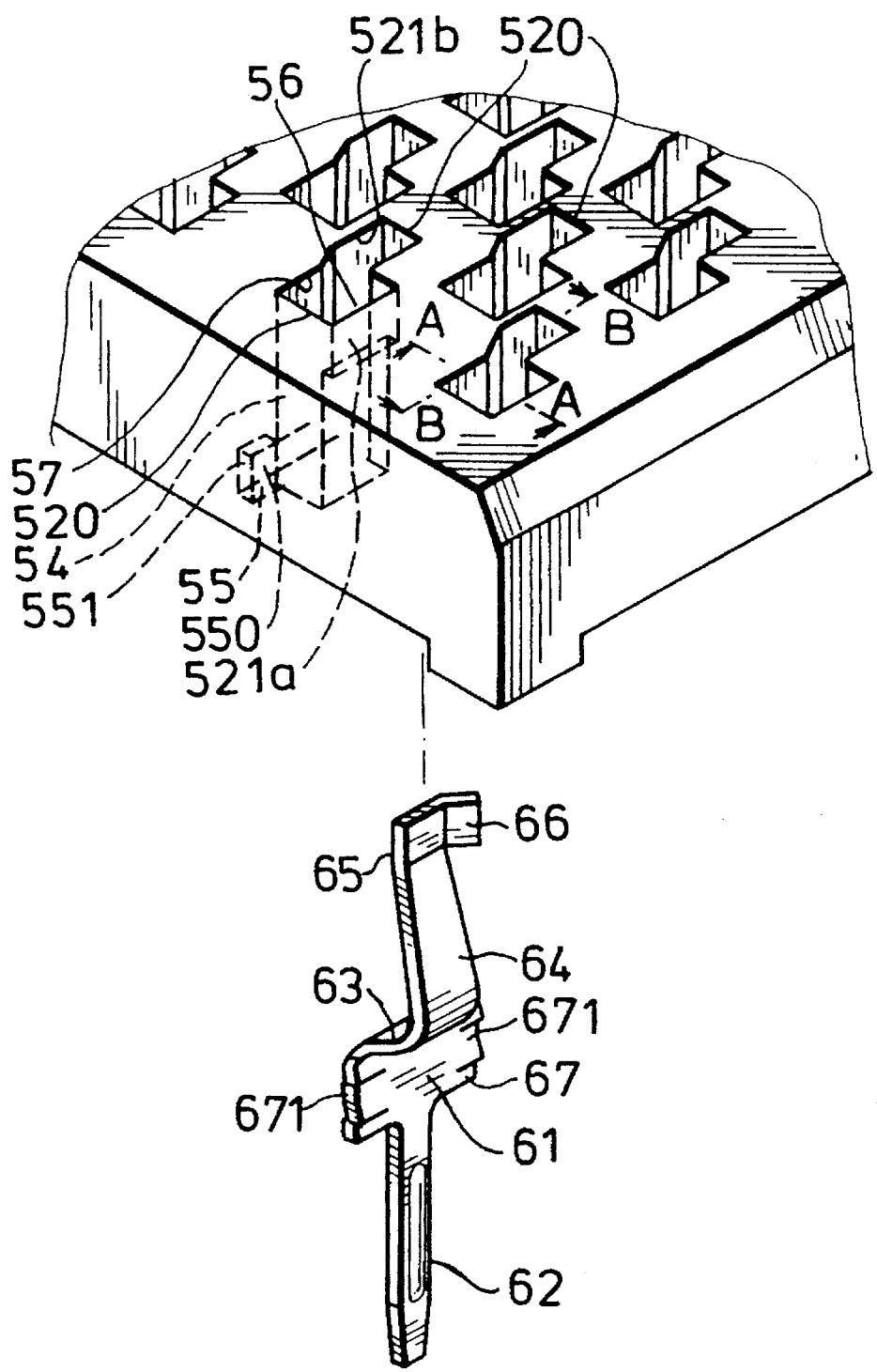
FIG. 6 shows a part of the base body of the socket assembly of the present invention, illustrating a terminal being inserted thereinto during assembly.

Referring to FIGS. 4 to 6, the base body 50 has a top surface, a bottom surface, a plurality of terminal-receiving holes 52 formed through the top and bottom surfaces, and a plurality of terminals 60 mounted in the terminal-receiving holes 52.

Each of the terminals 60 is a one-piece unit and includes a flat body portion 61 having left and right opposed end portions 67, an upper edge and a lower edge for mounting in the base body 50, a substantially L-shaped head portion formed integrally with and projecting upwardly from the upper edge, and a leg portion 62 which extends integrally and downwardly from the lower edge of the flat body portion 61. The opposed end portions 67 of the flat body portion 61 are provided with engaging means, such as protrusions 671 which are formed by cutting the opposed end portions 67 and bending some of the cutting edges so as to protrude outwardly and downwardly therefrom. The L-shaped head portion has a transverse width smaller than that of the flat body portion 61 and is constituted by a first section 63 which extends integrally and substantially horizontally from the upper edge of the flat body portion 61, and a second section 64 which is formed integrally with and which extends in a tapered width slantingly from a distal edge of the first section 63 opposed to the upper edge of the flat body portion 61, thereby forming an acute angle therebetween. The second section 64 further includes a distal end portion with a first part 65 for abutting the pin of the IC, which is substantially parallel to the plane of the flat body portion 61 and almost in a same plane with the body portion 61, and a second part 66 angled to the plane of the first part 65 for guiding the pin to contact the first part 65. The width of the distal end portion which includes the first part 65 and the second part 66, is not larger than that of the flat body portion 61 of the terminal 60. The angle between the flat body portion 61 and the first section 63 and that between the first section 63 and the second section 64 are rounded so as to enhance elasticity of the terminal 60. Incidentally, the distal end portion might be in a form of a curve having an outer curved surface which serves as the contact surface. The distal end portion could also be merely the end edge of the second section 64. In such a case, the end edge is curved so that the pin of the IC can be easily moved to make contact therewith.

Figure 7B:
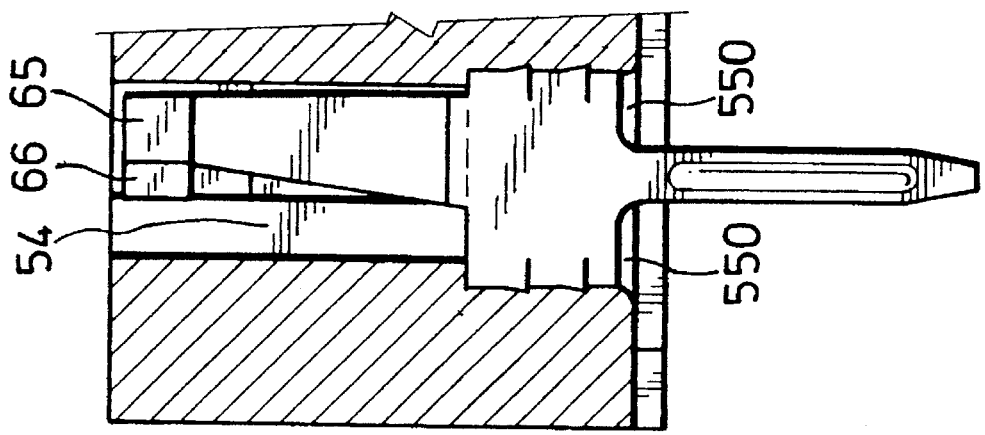
FIG. 7(B) shows a cross sectional view of the base body of FIG. 6 taken along the line B—B.
Figure 7A:
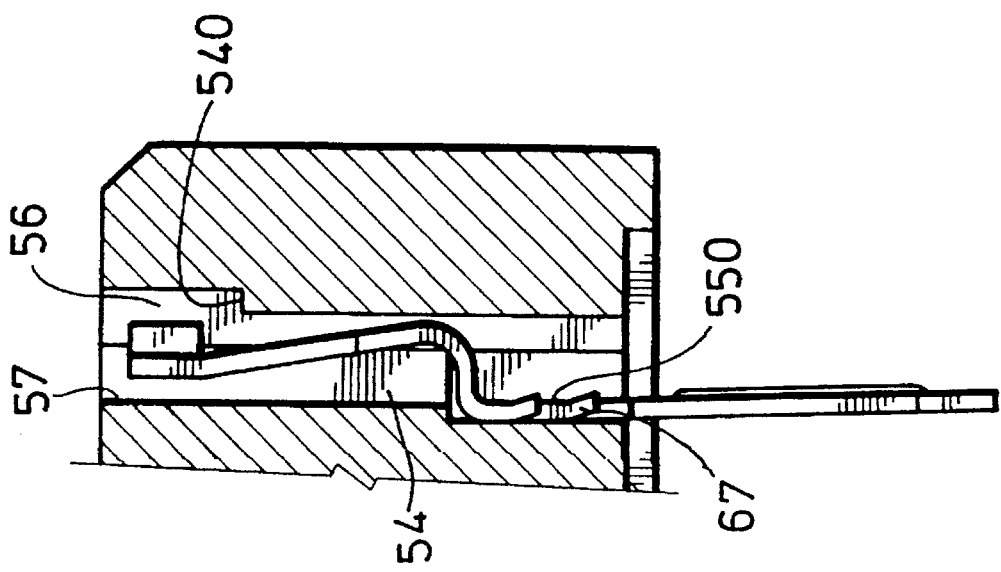
FIG. 7(A) shows a cross sectional view of the base body of FIG. 6 taken along the line A—A.

Referring to FIGS. 6, 7(A) and 7(B), each of the terminal-receiving holes 52 of the base body 50 is confined by a surrounding wall which is constituted by first and second pairs of opposed wall portions 520, 521a, 521b. The distance between the second pairs of opposed wall portions 521a, 521b is substantially equal to or slightly larger than the horizontal length of the first section 63 of the terminal 60.

The first opposed wall portions 520 have two opposed slit recesses 55 (only one is shown) opened to the bottom surface of the base body 50.

One of the second opposed wall portions 521a has a rectangular recess 56 which is opened to the top surface of the base body 50 and which is shaped such that the second part 66 of the terminal 60 can be received therein. The other one of the second opposed wall portions 521b has a substantially rectangular plane protrusion 57 which substantially corresponds to the L-shaped head portion and which protrudes toward the wall portion 521a such that the pin of the IC chip may abut against the same when the pin is moved into a terminal-contacting position, thereby providing an enhanced gripping force in cooperation with the terminal 60. Moreover, the step 540 formed between the vertical side of the rectangular plane protrusion 57 of the wall portion 521a and the non-protrusive portion thereof is a slant and inclines toward the pin 30 (see FIG. 8) of the IC chip so as to guide the pin 30 to the terminal-contacting position. Furthermore, the lower edge of the plane protrusion 57 can be an upper wall defining the slit recess 55, as illustrated in FIG. 6, or can extend to the bottom surface of the base body 50. However, in case of the latter, the recesses 55 are located in a position offset, i. e. toward the wall portion 521a, to that in the former. Furthermore, the plane protrusion 57 could be merely a rib.

The terminal 60 is inserted from the bottom surface of the base body 50 into the terminal-receiving holes 52 of the same such that the protrusions 671 of the terminal 60 engage the walls 550, 551 defining the slit recess 55, thereby retaining the L-shaped head portion of a respective one of the terminals 60 at the upper space of the hole 52 between the second opposed wall portions 521, as shown in FIGS. 7(A) and 7(B).

Figure 8:
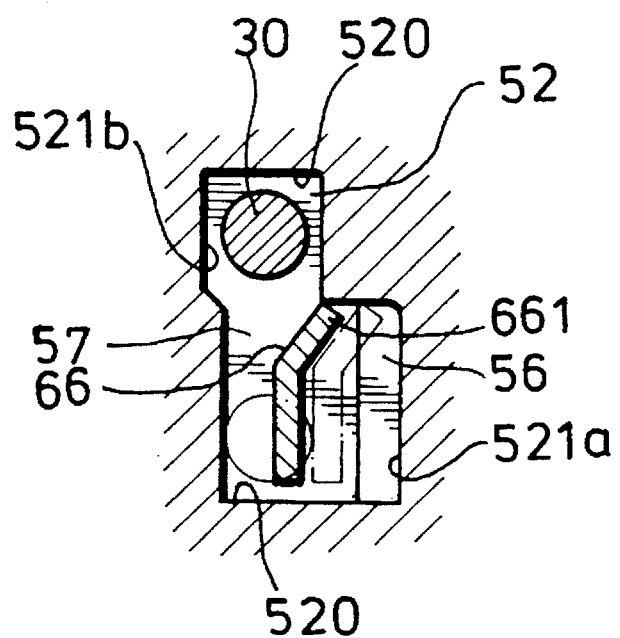
FIG. 8 shows a top view of the base body of the socket assembly of the present invention, illustrating the position of the pin of an IC chip relative to the terminal mounted in the base body.

Referring to FIG. 8, the plane protrusion 57 and the distal end portion 65, 66 of the terminals 60 define cooperatively a receiving space therebetween which is substantially smaller than a diameter of a pin of the IC chip. As illustrated, the pin 30 of the IC chip is spaced from the terminal 60 of the base body 50 after the former is mounted on the latter via an IC mounting plate (not shown). When it is desired to form an electrical contact between the IC chip and the terminals 60 of the base body 50, the IC mounting plate (not shown) is moved by pivoting the actuating lever as described in the prior art.

As mentioned above, one can clearly see that, since the width of the L-shaped head portion is not larger than the flat body portion 61 and since there are slit recesses provided in the lower end of the wall portions 520 for engaging the protrusion 671 provided in the terminal 60, the head portion of the terminal 60 can be inserted into the terminal-receiving hole 52 of the base body 50 from the bottom surface of the base body 50 and the terminal 60 is fixed in the base body 50, thereby providing a more convenient manufacturing process.

Moreover, in terms of the configuration of the terminal 60, since the horizontal first section 63 can provide a largest length and enhanced resiliency for the second section 64, the head portion of the terminal 60 has a better elasticity than the prior art. Thus, a material with a poor elasticity can be used to reduce the cost of production.

With the present invention thus explained, it is obvious to those skilled in the art that various modifications and variations can be made without departing from the scope and spirit thereof. It is therefore intended that the present invention is not limited to the exact disclosure but only in the appended claims.

I claim:

1. A socket assembly for an integrated circuit chip, said socket assembly including a base body having a top surface, a bottom surface, a plurality of terminal-receiving holes formed through said top and bottom surfaces, and a plurality of conductive terminals mounted in said terminal-receiving holes, each of said terminals having a flat body portion for mounting in said base body, a head portion formed integrally with and projecting upwardly from said flat body portion so as to be located adjacent to said top surface and to contact with a pin of an IC chip which is to be inserted thereinto, and a leg portion extending integrally and downwardly from said flat body portion and projecting out from said bottom surface of said base body, said socket assembly being characterized in that:

said flat body portion having an upper edge, a lower edge, and left and right end portions which are provided with engaging means respectively for mounting in said base body, said head portion being formed substantially as an L-shaped member has a transverse width smaller than that of said flat body portion and which is constituted by a first section extending integrally and substantially horizontally from said upper edge of said flat body portion, and a second section formed integrally with and extending slantingly and upwardly from a distal edge of said first section opposite to said upper edge of said flat body portion, thereby forming an acute angle in cooperation with said first section, said second section further having a distal end portion for contacting with the pin of the IC chip; and said terminal-receiving hole being confined by a surrounding wall which is constituted by first and second pairs of opposed wall portions, said first opposed wall portions having two opposed slit recesses opened to said bottom surface for receiving engageably said engaging means of said flat body portion, thereby retaining said L-shaped member resiliently and movably between said second opposed wall portions, wherein one of said second opposed wall portions has a recess which is shaped and located such that a portion of said distal end portion of said terminal can be received therein, and wherein said recess opens to said top surface of said base body.

2. A socket assembly for an integrated circuit chip, said socket assembly including a base body having a top surface, a bottom surface, a plurality of terminal-receiving holes formed through said top and bottom surfaces, and a plurality of conductive terminals mounted in said terminal-receiving holes, each of said terminals having a flat body portion for mounting in said base body, a head portion formed integrally with and projecting upwardly from said flat body portion so as to be located adjacent to said top surface and to contact with a pin of an IC chip which is to be inserted thereinto, and a leg portion extending integrally and downwardly from said flat body portion and projecting out from said bottom surface of said base body, said socket assembly being characterized in that:

said flat body portion having an upper edge, a lower edge, and left and right end portions which are provided with engaging means respectively for mounting in said base body, said head portion being formed substantially as an L-shaped member has a transverse width smaller than that of said flat body portion and which is constituted by a first section extending integrally and substantially horizontally from said upper edge of said flat body portion, and a second section formed integrally with and extending slantingly and upwardly from a distal edge of said first section opposite to said upper edge of said flat body portion, thereby forming an acute angle in cooperation with said first section, said second section further having a distal end portion for contacting with the pin of the IC chip; and said terminal-receiving hole being confined by a surrounding wall which is constituted by first and second pairs of opposed wall portions, said first opposed wall portions having two opposed slit recesses opened to said bottom surface for receiving engageably said engaging means of said flat body portion, thereby retaining said L-shaped member resiliently and movably between said second opposed wall portions, wherein one of said second opposed wall portions has a protrusion protruding toward the other one of the second opposed wall portions such that the pin of the IC chip may abut against said protrusion when the pin is moved into a terminal-contacting position.

3. The socket assembly as defined in claim 2, wherein a step formed between a top protruding surface of said protrusion and the surface of said wall portion inclines in a direction the pin of the IC chip moves when contacting with said terminal.

4. A socket assembly for an integrated circuit chip, said socket assembly including a base body having a top surface, a bottom surface, a plurality of terminal-receiving holes formed through said top and bottom surfaces, and a plurality of conductive terminals mounted in said terminal-receiving holes, each of said terminals having a flat body portion for mounting in said base body, a head portion formed integrally with and projecting upwardly from said flat body portion so as to be located adjacent to said top surface and to contact with a pin of an IC chip which is to be inserted thereinto, and a leg portion extending integrally and downwardly from said flat body portion and projecting out from said bottom surface of said base body, said socket assembly being characterized in that:

said flat body portion having an upper edge, a lower edge, and left and right end portions which are provided with engaging means respectively for mounting in said base body, said head portion being formed substantially as an L-shaped member has a transverse width smaller than that of said flat body portion and which is constituted by a first section extending integrally and substantially horizontally from said upper edge of said flat body portion, and a second section formed integrally with and extending slantingly and upwardly from a distal edge of said first section opposite to said upper edge of said flat body portion, thereby forming an acute angle in cooperation with said first section, said second section further having a distal end portion for contacting with the pin of the IC chip; and said terminal-receiving hole being confined by a surrounding wall which is constituted by first and second pairs of opposed wall portions, said first opposed wall portions having two Opposed slit recesses opened to said bottom surface for receiving engageably said engaging means of said flat body portion, thereby retaining said L-shaped member resiliently and movably between said second opposed wall portions, wherein said engaging means comprises at least one protrusion projecting outwardly from a plane of said end portion of said flat body portion.

5. The socket assembly as defined in claim 4, wherein said protrusion is formed by cutting said end portion and bending a cutting edge outwardly.

6. A socket assembly for an integrated circuit chip, said socket assembly including a base body having a top surface, a bottom surface, a plurality of terminal-receiving holes formed through said top and bottom surfaces, and a plurality of conductive terminals mounted in said terminal-receiving holes, each of said terminals having a flat body portion for mounting in said base body, a head portion formed integrally with and projecting upwardly from said flat body portion so as to be located adjacent to said top surface and to contact with a pin of an IC chip which is to be inserted thereinto, and a leg portion extending integrally and downwardly from said flat body portion and projecting out from said bottom surface of said base body, said socket assembly being characterized in that:

said flat body portion having an upper edge, a lower edge, and left and right end portions which are provided with engaging means respectively for mounting in said base body, said head portion being formed substantially as an L-shaped member has a transverse width smaller than that of said flat body portion and which is constituted by a first section extending integrally and substantially horizontally from said upper edge of said flat body portion, and a second section formed integrally with and extending slantingly and upwardly from a distal edge of said first section Opposite to said upper edge of said flat body portion, thereby forming an acute angle in cooperation with said first section, said second section further having a distal end portion for contacting with the pin of the IC chip; and said terminal-receiving hole being confined by a surrounding wall which is constituted by first and second pairs of opposed wall portions, said first opposed wall portions having two opposed slit recesses opened to said bottom surface for receiving engageably said engaging means of said flat body portion, thereby retaining said L-shaped member resiliently and movably between said second opposed wall portions, wherein said distal end portion is in a form of a plane section and comprises a first part substantially parallel to a plane of said flat body portion for abutting against the pin of the IC chip and a second part bent relative to said first part for guiding the pin into the first part, and wherein said second section has a width which tapers from one end connecting with said first section to the other end connecting with said distal end portion.

7. A terminal to be inserted in a terminal-receiving hole of a base body of a socket assembly, comprising:

a one-piece unit having a flat body portion with an upper edge, a lower edge opposite to said upper edge and left and right rear opposed end portions, said flat body portion having engaging means at said left and right opposed end portions;

an L-shaped head member having a first section extending integrally and substantially horizontally from said upper edge of said flat body portion and having a width smaller than that of said flat body portion, a second section extending integrally and slantingly from a distal edge of said first section opposite to said upper edge of said flat body portion, thereby forming an acute angle in cooperation with said first section, said second section further having distal end portion for contacting with the pin of the IC chip, wherein the second section has a width which tapers from one end connecting with said first section to the other end connecting with said distal end portion; and a leg portion extending integrally downwardly from said lower edge of said flat body portion.

\* \* \* \* \*